(12) United States Patent
Sullivan

(10) Patent No.: US 7,529,641 B2
(45) Date of Patent: May 5, 2009

(54) MIXED SIGNAL DISPLAY FOR A MEASUREMENT INSTRUMENT

(75) Inventor: Steven K. Sullivan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/408,462

(22) Filed: Apr. 21, 2006

(65) Prior Publication Data

US 2007/0250278 A1 Oct. 25, 2007

(51) Int. Cl.
*G06F 19/00* (2006.01)

(52) U.S. Cl. ...................................... 702/176
(58) Field of Classification Search ............... 702/176
See application file for complete search history.

(56) References Cited

U.S. PATENT DOCUMENTS

| | | | |
|---|---|---|---|
| 4,541,100 | A | 9/1985 | Sutton et al. |
| 4,558,379 | A | 12/1985 | Hutter et al. |
| 5,446,650 | A | 8/1995 | Overhage |
| 5,526,283 | A | 6/1996 | Hershey |
| 5,526,286 | A | 6/1996 | Sauerwein |
| 5,706,203 | A | 1/1998 | Kawauchi |

FOREIGN PATENT DOCUMENTS

| | | |
|---|---|---|
| GB | 2115161 | 9/1983 |
| JP | 04265994 | 9/1992 |

OTHER PUBLICATIONS

Agilent Vector Signal Analysis Basics, Agilent Technologies, Application note 150-15, Printed Jul. 14, 2004, p. 1-40.*

Introduction to mixed signal test solutions, Tektronix, p. 1-12 (submitted by applicant on Jun. 30, 2008).*

Agilent Technologies, Inc.: "Agilent Technologies: Infinium 54830 Series Oscilloscopes" [Online], Aug. 10, 2005 (Aug. 10, 2005), XP002446209 USA. Retrieved from the Internet: URL: http://cp.literature.agilent.com/litweb/pdf/5988-3788EN.pdf>, [retrieved on Aug. 2, 2007] whole document.

Hascher W.: "Oszilloskope: Die Software Macht's in Allen Geraetekategorien Gibt Es Weiterentwicklungen - Ein Ueberblick" Elektronik, Weka Fachzeitschriftenverlag, Poing, DE, vol. 51, No. 18, Sep. 3, 2002 (Sep. 3, 2002), pp. 82-84, 86, XP001122962, ISSN: 0013-5658, (the whole document.) Translation attached.

* cited by examiner

*Primary Examiner*—Tung S Lau
(74) *Attorney, Agent, or Firm*—Francis I. Gray; Thomas F. Lenihan

(57) ABSTRACT

A mixed signal measurement instrument provides for the display of both analog and logic signal waveforms using a "no dead time" architecture. For a logic signal all trigger events are detected, the logic signal is sampled at a high rate to produce a sampled logic signal data, the sampled logic signal data are delayed to provide a pre-trigger delay and then are drawn in real time in response to the detected trigger events. A FIFO is used to delay the sampled logic signal data, with the position of the trigger event on the display being determined coarsely by an effective depth of the FIFO. The sampled logic signal data may also be compressed into compression codes prior to the FIFO. A fast drawing engine receives the sampled logic signal data from the FIFO as either data samples or compression codes, and draws a logic waveform using four rows of the drawing engine memory—one row for each of four logic states. The vertical position and height of the logic signal waveform on the display is determined when the logic waveform is transferred from the fast drawing engine to a conventional display buffer.

9 Claims, 4 Drawing Sheets

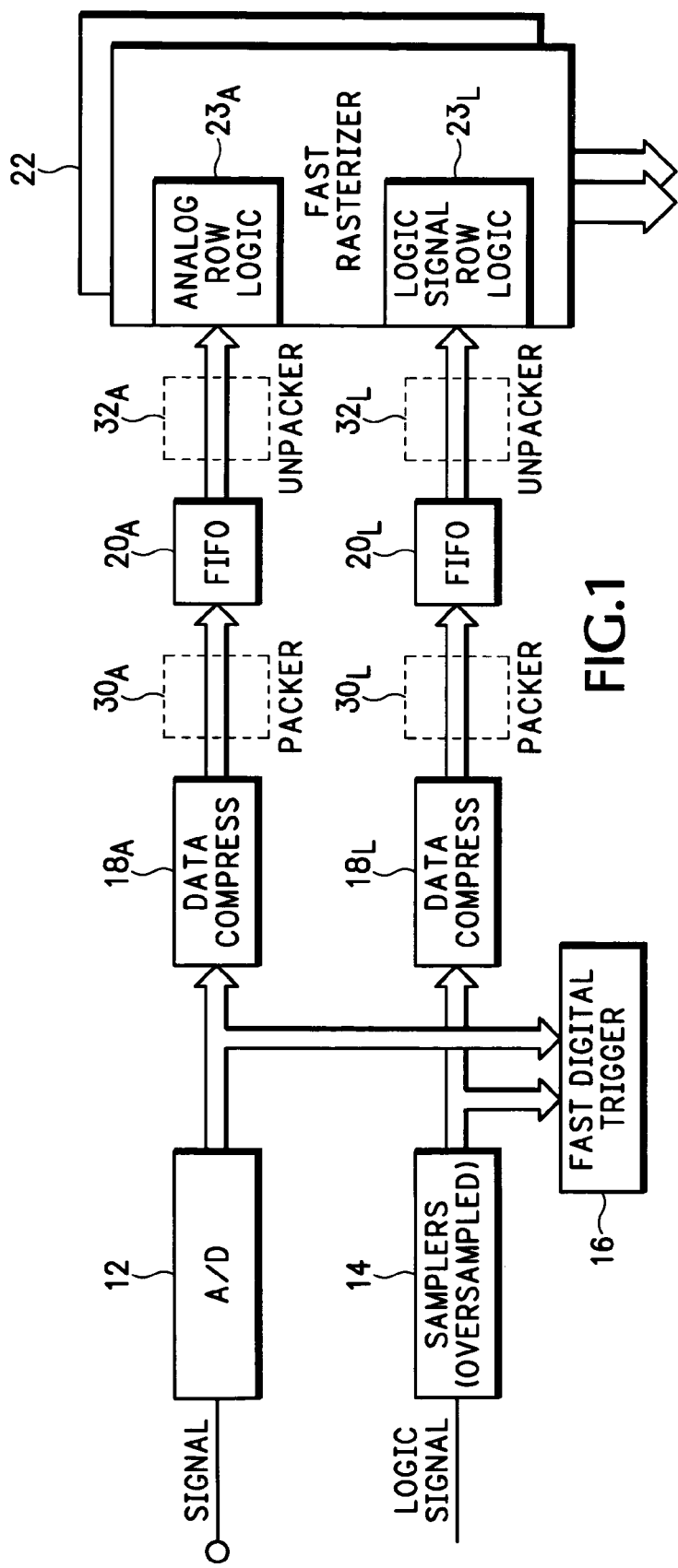
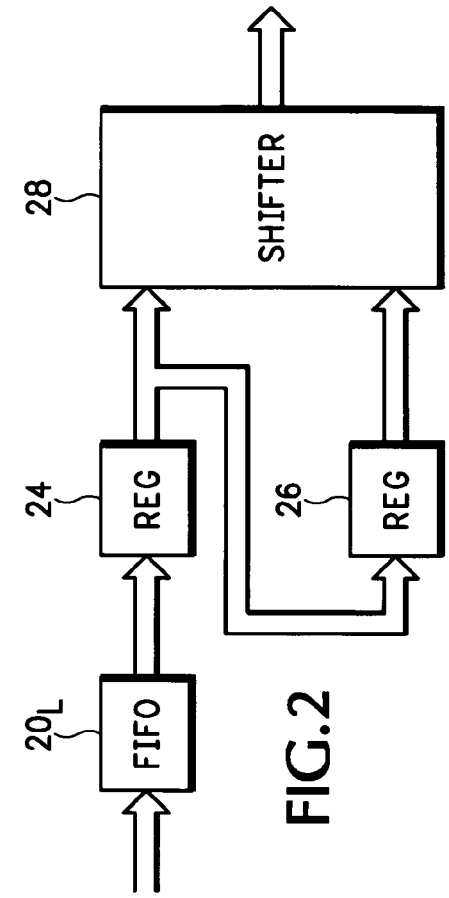
FIG.1
FIG.2

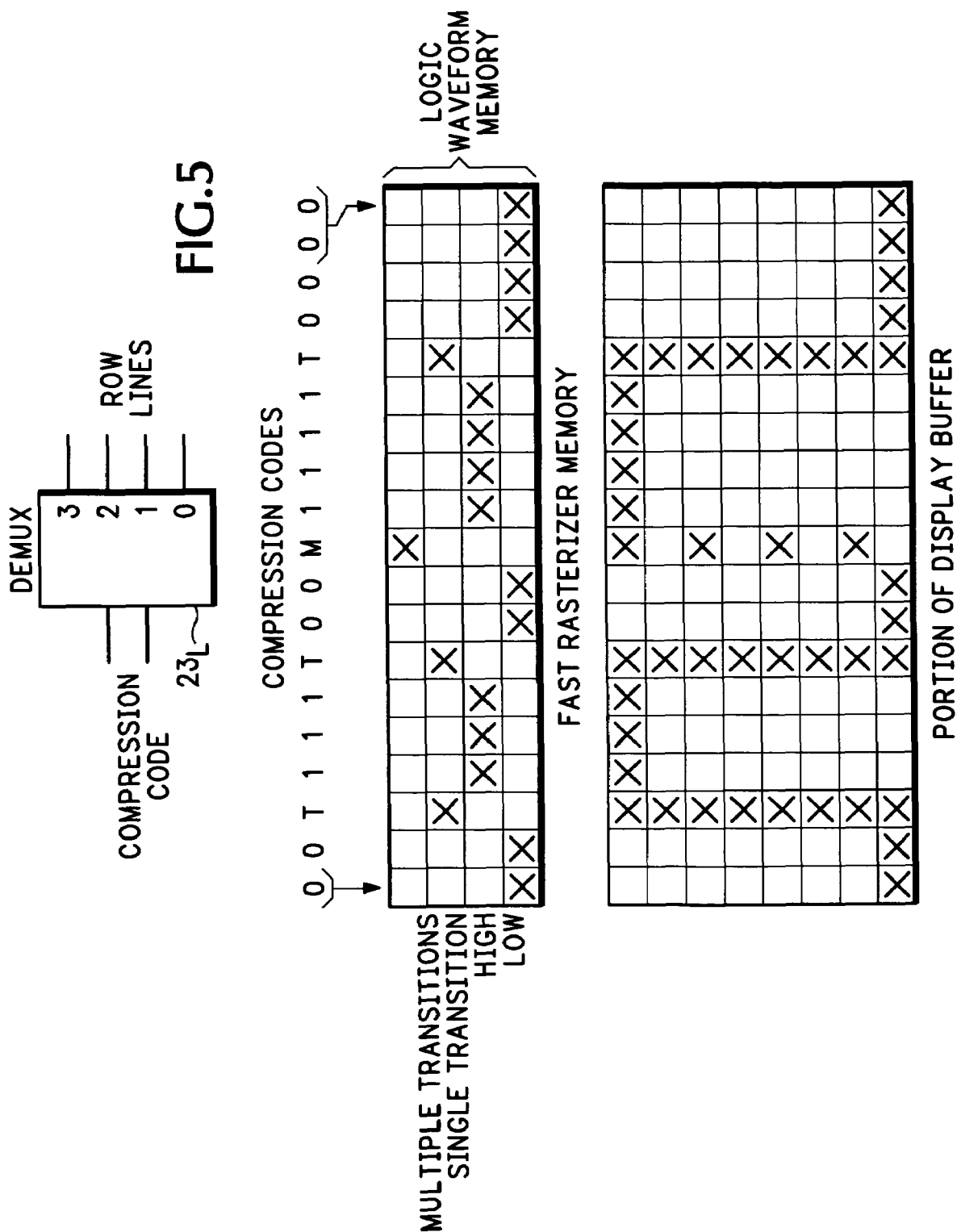

MIXED SIGNAL DISPLAY FOR A MEASUREMENT INSTRUMENT

BACKGROUND OF THE INVENTION

The present invention relates to the display of acquired signal data, and more particularly to a mixed signal display for a measurement instrument that shows both analog and logic signal waveforms using a "no dead time" data acquisition architecture.

In mixed signal measurement instruments analog signals are digitized and logic signals are sampled. In older instruments the digitization rate of the analog signals often matched the sample rate of the logic signals. When the digitization rate became fast enough relative to the analog signal channel bandwidth, it became possible to interpolate the digitized analog signal data so that continuous analog waveforms could be drawn on a display screen even when the display resolution is greater than the resolution of the digitized analog signal data. Since it is not possible to interpolate the sampled logic signal data, hardware was developed to sample the logic signals at rates much higher than a system clock. Such hardware is currently being used in logic analyzers to implement a MagnIVU™ acquisition system as found in the TLA Series of logic analyzers manufactured by Tektronix, Inc. of Beaverton, Oreg.—see U.S. Pat. No. 5,526,286 entitled "Oversampled Logic Analyzer."

The measurement instruments store the acquired analog and/or logic signal data in an acquisition memory. Concurrently a trigger system observes one or more input signal channels to detect trigger events. During a pre-trigger time data is stored in the acquisition memory, but trigger events detected by the trigger system are ignored. After the pre-trigger data is stored a detected trigger event starts a post-trigger time during which data continues to be stored in the acquisition memory. Once the post-trigger time starts, additional detected trigger events are ignored. At the end of the post-trigger time writing of data into the acquisition memory is halted. The digitized analog signal data and/or sampled logic signal data are then read from the acquisition memory and waveform images are drawn in a display buffer. Trigger events continue to be ignored until the data has been read from the acquisition memory, a new acquisition started and the next pre-trigger time has elapsed.

It is desirable in a mixed signal measurement instrument to be able to display all of the trigger events. As shown in co-pending U.S. patent application Ser. No. 11/388,428 entitled "No Dead Time Data Acquisition", the basic idea behind a "no dead time" data acquisition of an analog signal is an architecture that allows all trigger events to be shown on a display.

What is desired is the ability in a no dead time data acquisition architecture to also draw logic signals together with analog signals for display at the same high rate.

BRIEF SUMMARY OF THE INVENTION

Accordingly the present invention provides a mixed signal measurement instrument for displaying both analog and logic signal waveforms using a "no dead time" data acquisition architecture. For a logic signal all trigger events are detected, the logic signal is sampled at a high rate to produce sampled logic signal data, the sampled logic signal data are delayed to provide a pre-trigger delay, and the sampled logic signal data are drawn in real time in response to the detected trigger events. A FIFO is used to delay the sampled logic signal data, with the position of the trigger event on the display being determined coarsely by an effective depth of the FIFO. The sampled logic signal data may also be compressed into compression codes prior to the FIFO. A fast drawing engine receives the sampled logic signal data from the FIFO as either data samples or compression codes, and draws a logic waveform using four rows of the drawing engine memory—one row for each of four logic states. The vertical position and height of the logic signal waveform on the display are determined when the logic waveform is transferred from the fast drawing engine to a conventional display buffer.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a block diagram view of a "no dead time" data acquisition architecture for a mixed signal display including logic signals according to the present invention.

FIG. 2 is a block diagram view of a fine data positioning circuit according to the present invention.

FIG. 5 is a combined circuit and plan view illustrating drawing of logic compression codes for display according to the present invention.

DETAILED DESCRIPTION OF THE INVENTION

Figure 3:
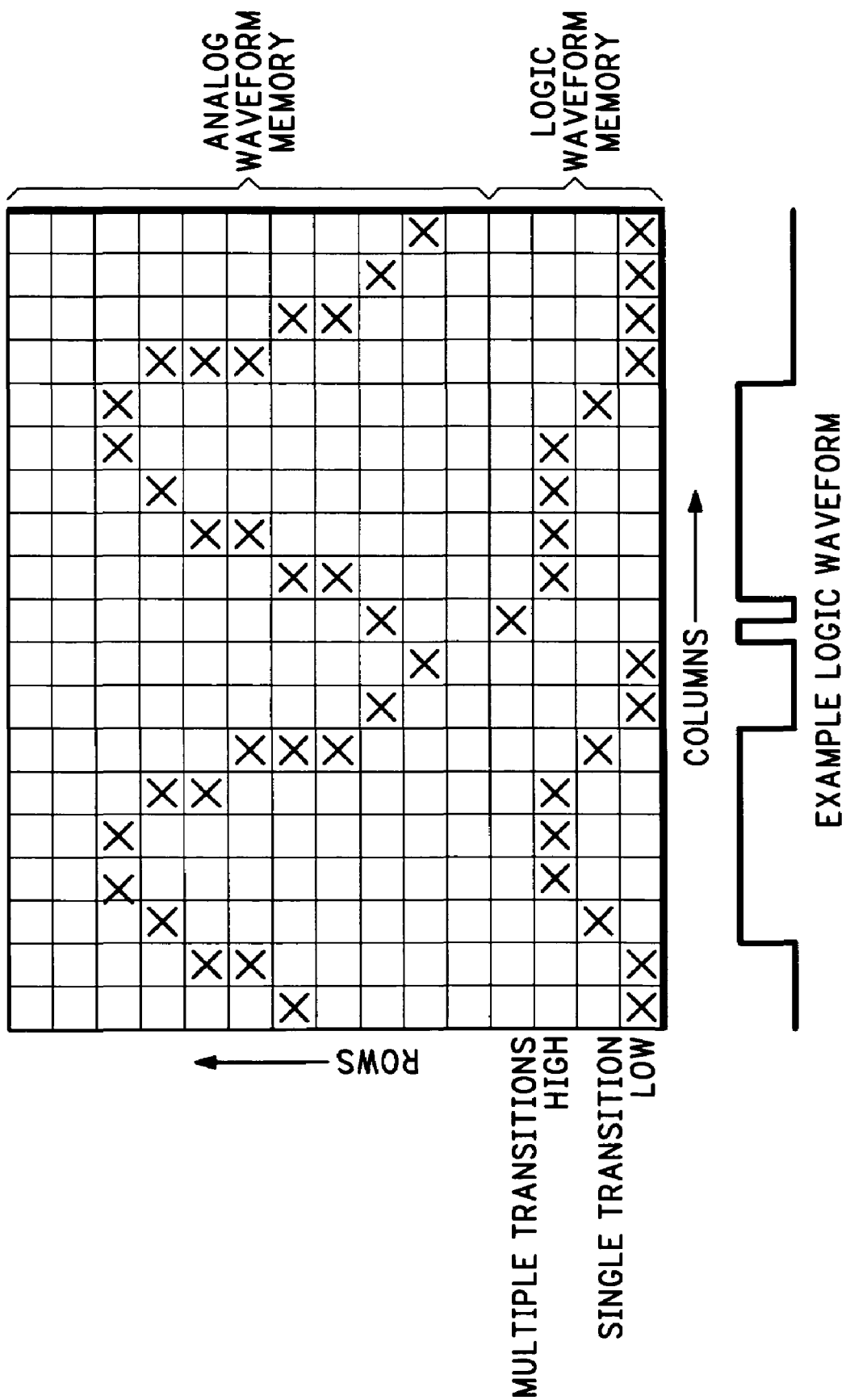
FIG. 3 is a plan view illustrating concurrent analog and logic data drawn in memory according to the present invention.

Referring now to FIG. 1 a "no dead time" data acquisition architecture for a mixed signal measurement instrument, such as a digital oscilloscope, is shown. By definition "no dead time" means all trigger events are shown on a display screen, every waveform image associated with the trigger events has a trigger event at a specified trigger location T on the display screen, and it is not necessary (or desirable) to display all trigger events at the specified trigger location.

In order to detect every trigger event, fast trigger detection is required. In addition to detecting each trigger event, the time of each trigger event relative to the acquired data is computed. Although an analog trigger generator may be realized to detect every trigger event, in the preferred embodiment analog signals being monitored are digitized by an analog-to-digital converter (ADC) 12 to produce digital analog signal data, and logic signals being monitored are oversampled by appropriate samplers 14 to produce sampled logic signal data. The digitized analog signal data and sampled logic signal data follow respective processing paths, and are input to a digital trigger circuit 16 such as the one described in co-pending U.S. patent application Ser. No. 11/388,925 entitled "Improved Digital Trigger" which detects each trigger event and the trigger point in time. The logic signal is sampled at a very high rate. The desired sample rate is a rate that is as fast as a maximum display resolution. The logic sample rate is typically much higher than the bandwidth of the measurement instrument. It is also desirable for the logic sample rate to be higher than the analog signal sample rate. The analog signal usually may be interpolated to obtain an accurate representation of the analog signal with a higher effective sample rate. But logic signals cannot be interpolated. The digitized analog signal data and sampled logic signal data are input to respective data compressors 18 to reduce the amount of data for storage without losing any significant features of the signals.

For logic signals a compression technique as disclosed in co-pending U.S. patent application Ser. No. 11/266,105 entitled "Compressed Logic Sample Storage" may be used to compress the sampled logic signal data down to a display sample rate. The instrument user selects a display resolution by adjusting a "time-per-division" control. When the display sample rate is less than the sample rate of the logic signals, hardware reduces the logic signal sample rate so it is similar to the display sample rate. This reduction may be accomplished through decimation, compression or a combination of decimation and compression. When the logic sample rate is much higher than the maximum signal bandwidth, the sample rate may be reduced without much loss through decimation. However when the sample rate is around the maximum signal bandwidth, decimation may cause narrow pulses to be lost. For this reason it is preferable to use compression as described in the above-mentioned Compressed Logic Sample Store U.S. Patent Application. Since decimation is easier to implement, a combination of decimation (to get the sample rate down near a system clock rate of the hardware) followed by compression (to get the sample rate down to the desired display sample rate) works well.

Digital measurement instruments need to be able to draw a portion of the digitized signal before a trigger event. For logic signals, as for analog signals, the hardware has to wait until the trigger generator 16 recognizes a trigger event before it knows to start drawing a signal waveform. Therefore to draw the portion of the signal that appears before the trigger event, the digitized analog signal data and sampled logic signal data are stored in respective first-in, first-out (FIFO) buffers 20 that allow a specified amount of data prior to the trigger event to be stored, i.e., provides a pre-trigger time. A similar FIFO 20 is described in U.S. Pat. No. 5,706,203 entitled "Waveform Measuring Apparatus for Easily Providing Pretrigger Function by Using FIFO Memory." The FIFO 20 delays the signal data so that, after the trigger event is detected, the first signal data to be drawn is delivered to a waveform drawing engine 22 from the FIFO. Ideally the sampled logic signal data is entered into the FIFO $20_L$ at a rate that is similar to the display sample rate, and the maximum FIFO depth is at least as long as the display area is wide, i.e., equals the horizontal width in pixels of the display. This allows the trigger position to be moved about the display.

When the display sample rate is very high, and the sampled logic signal data is sampled at a rate much higher than the system clock, it becomes difficult to enter data into the FIFO $20_L$ at the logic signal sample rate. Therefore the FIFO $20_L$ is made wider (number of bits per input cycle) and the data is entered at a slower rate. This results in a fairly wide FIFO $20_L$, but it allows the sampled logic signal data to pass through the FIFO at a rate that supports the display sample rate. For the fastest logic signal sample rates, the FIFO $20_L$ may become very wide so in that case the sampled logic signal data may be converted into time stamps which are passed through the FIFO. This works because the logic signal sample rate is much higher than the signal bandwidth. The data leaving the FIFO $20_L$ may be in a few different forms: at the fastest sample rate the sampled logic signal data may be in the form of samples; and at slower sample rates the sampled logic signal data may be in the form of compression codes that describe the behavior of the logic signal over an interval of time, i.e., always high, always low, a single transition and multiple transitions.

The output from the FIFO $20_L$ is in the form of many logic signal samples or compression codes delivered in parallel. The trigger generator 16 determines the time of the trigger event relative to the system clock. The trigger time is used to shift the sampled logic signal data. The sampled logic signal data may also be shifted to allow the user to adjust a horizontal trigger position on the display. Coarse changes in horizontal trigger position are accomplished by changing the effective depth of the FIFO $20_L$. Fine changes are made by placing the sampled logic signal data into a series of flip-flops or registers and using multiplexers or shifters to select, forwards or backwards in time, which flip-flops or register outputs are passed on to the next hardware block. FIG. 2 shows the output from the FIFO $20_L$ being input to a pair of registers 24, 26 in series, with the outputs from the registers being input to a shifter 28. The output from the shifter 28 provides the fine positional adjustment forwards or backwards in time from the register outputs.

The outputs of the FIFOs 20 are sent to the waveform drawing engine 22 via respective row logic circuits 23, at the center of which is a custom memory as described in co-pending U.S. patent application Ser. No. 11/393,129 entitled "Fast Rasterizer." Each bit in the custom memory corresponds to a pixel in a black-and-white image of the waveform. The custom memory is built so that in one clock cycle at the fastest drawing rate an N-column wide image of the waveform may be drawn in the custom memory. This allows the waveform image to be drawn as fast as the data samples of the digitized signal are acquired. For drawing logic signal waveforms the vertical axis drawing hardware is modified. In a mixed signal measurement instrument that displays both analog signals and logic signals, the drawing engine 22 may be used to draw both types of signals, as shown in FIG. 3. The vertical axis drawing circuit for the logic signals is described below.

Figure 4:
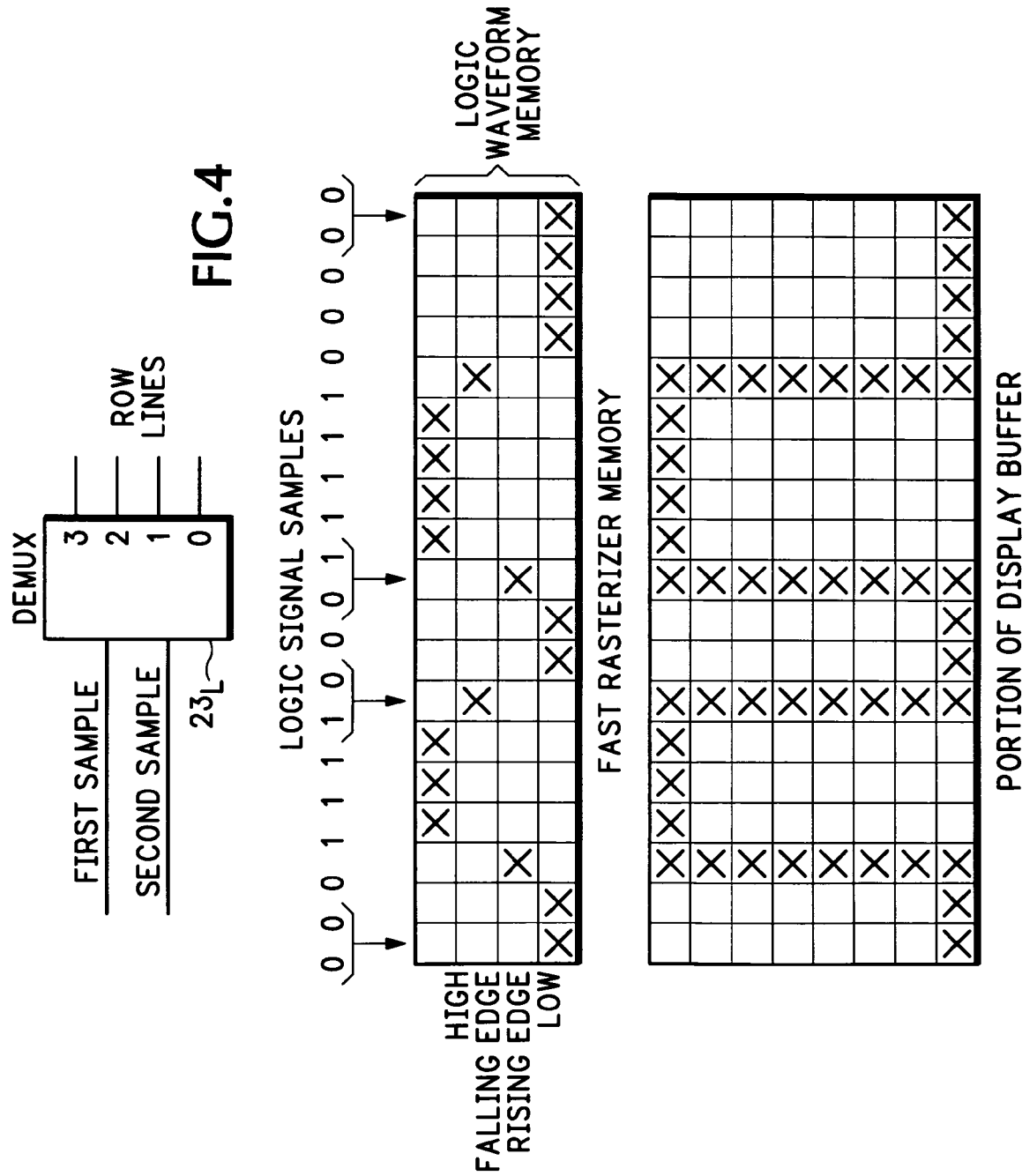
FIG. 4 is a combined circuit and plan view illustrating drawing of logic samples for display according to the present invention.

To draw very rapidly the drawing engine 22 has many sections, potentially all operating in parallel as described in the above-mentioned Fast Rasterizer patent application. Each section is responsible for drawing some of the columns of the waveform. When drawing analog waveforms, each section includes a row logic circuit $23_A$ that determines which vertical pixels are set in a particular display column so that, when all of the sections are interleaved and viewed, a picture of the analog waveform is seen. Unlike analog signals that use many rows, each logic signal uses just a few rows of the drawing engine 22 to draw the logic signal—see FIG. 3. For example, four rows may be used to hold four compression logic states: the first row is asserted when the logic signal is low; the second row asserted when the logic signal makes a single transition; the third row is asserted when the logic signal is high; and the fourth row is asserted when the logic signal makes two or more transitions. When sampled logic signal data is passing through the FIFO $20_L$, each section of the drawing engine 22 receives two consecutive samples, as shown in FIG. 4. From these two samples the row logic circuit $23_L$ determines if the logic signal is low or high for the interval, or if there is a single transition according to the following table:

| First Sample | Second Sample | Logic State |
|---|---|---|
| 0 | 0 | Low |
| 0 | 1 | Rising Edge |
| 1 | 0 | Falling Edge |
| 1 | 1 | High |

When compression codes pass through the FIFO $20_L$, each section of the drawing engine 22 receives one 2-bit compression code, as shown in FIG. 5 that is decoded by the row logic circuit $23_L$ to select one of the four row lines.

| Compression Code (binary) | Symbol | Logic State |
|---|---|---|
| 00 | 0 | Low |
| 01 | 1 | High |
| 10 | T | Single Transition |
| 11 | M | Multiple Transitions |

The logic signal data are read from the drawing engine 22 at a slow rate and written into a conventional display buffer. During this process the vertical position of the logic signal waveform and the height of the logic signal waveform are determined, as shown in FIGS. 4 and 5. For samples the Low level sets a low level in the display buffer, the High level sets a high level in the display buffer, and the Rising and Falling Edges set a vertical series of pixels in the display buffer. For logic compression codes the Low level sets a low level in the display buffer, the High level sets a high level in the display buffer, the Single Transition sets a vertical series of pixels, and the Multiple Transitions sets an intermittent vertical row of pixels, i.e., is drawn in a way to distinguish it from a normal transition. Each pixel in the display buffer may hold a color and an intensity, and the color for each logic state may be different. The multiple logic signals that make up a bus waveform are combined and drawn as a bus.

A packer 30 may be included between the data compressor 28 and the FIFO 20 to combine data from the data compressor into larger data widths as a function of the type of data compression being performed on the digitized signal. Concurrently an unpacker 32 may be included between the FIFO 20 and the drawing engine 22 to recover the digitized signal. The unpacker $32_A$ may include interpolation, if required for analog signals. A controller (not shown) receives the trigger events from the digital trigger circuit 16 and controls the operation of the drawing engine 22 to assure that the pre-trigger and post-trigger data are included and the position of the trigger is positioned accurately.

Thus logic signals may be drawn at the same high rate as analog signals on a mixed signal measurement instrument, which may include digital oscilloscopes, timing analyzers, logic analyzers and the like, by sampling at a high rate, compressing as necessary to a display sample rate and drawing using a drawing engine that writes multiple columns in parallel in an interleaved fashion.

What is claimed is:

1. An apparatus for providing a logic waveform display on a mixed signal oscilloscope using a "no dead time" architecture comprising:
   an analog channel receiving and processing an analog signal under test;
   a plurality of digital channels, each of said plurality of digital channels receiving and processing a respective logic signal under test;
   each of said digital channels including a sampler, each of said samplers continuously acquiring samples of said logic signal at a high sample rate;
   trigger circuitry coupled to a digital channel, said trigger circuitry detecting each trigger event within the logic signal;
   means for delaying the samples for a pre-trigger time to assure acquisition of a specified number of samples prior to each trigger event;
   means for drawing in real time the samples into a waveform memory at a display sample rate to produce a logic waveform;
   means for transferring the logic waveform to a display buffer at a specified vertical location and with a specified amplitude; and
   means for compressing the samples into compression codes for input to the delaying means, each of said compression codes exhibiting one of four predetermined logic states.

2. The apparatus as recited in claim 1 wherein the drawing means comprises means for logically drawing the samples into four rows of the waveform memory, each row representing one of said four states for the logic signal.

3. The apparatus as recited in claim 1 wherein the delaying means comprises means for shifting the samples to adjust a position of one of the trigger events relative to the samples on the logic signal display.

4. The apparatus as recited in claim 1 wherein the delaying means comprises a first-in, first-out (FIFO) buffer having the samples as an input and a delayed version of the samples as an output for input to the drawing means, the FIFO having a width that is a function of the high sample rate relative to a system clock.

5. The apparatus as recited in claim 2 wherein the logically drawing means comprises means for determining the one of the four states within a time interval from consecutive samples.

6. The apparatus as recited in claim 3 wherein the shifting means comprises:
   means for coarse shifting the samples; and
   means for fine shifting the samples.

7. The apparatus as recited in claim 6 wherein the coarse shifting means comprises a first-in, first-out (FIFO) buffer having an effective depth determined by an amount that the samples are to be shifted relative to position of the one trigger event.

8. The apparatus as recited in claim 7 wherein the fine shifting means comprises:
   a series of flip-flops into which the samples are input; and
   a multiplexer for selecting an output from one of the flip-flops to adjust the samples relative to the one trigger signal forwards or backwards in time.

9. An apparatus for providing a logic waveform display on a mixed signal measurement instrument using a "no dead time" architecture comprising:
   means for continuously acquiring samples of a logic signal at a high sample rate;
   means for detecting each trigger event within the logic signal;
   means for delaying the samples for a pre-trigger time to assure a specified number of samples prior to each trigger event;
   means for drawing in real time the samples into a waveform memory at a display sample rate to produce a logic waveform; and
   means for transferring the logic waveform to a display buffer at a specified vertical location and with a specified amplitude;
   wherein
   the delaying means comprises means for shifting the samples to adjust a position of one of the trigger events relative to the samples on the logic signal display;
   the shifting means comprises:
      means for coarse shifting the samples; and
      means for fine shifting the samples;

the coarse shifting means comprises a first-in, first-out (FIFO) buffer having an effective depth determined by an amount that the samples are to be shifted relative to position of the one trigger event;

the fine shifting means comprises:

a series of flip-flops into which the samples are input; and a multiplexer for selecting an output from one of the flip-flops to adjust the samples relative to the one trigger signal forwards or backwards in time.

* * * * *